United States Patent
Yoshikawa et al.

(10) Patent No.: US 9,773,721 B2
(45) Date of Patent: Sep. 26, 2017

(54) LEAD-FREE SOLDER ALLOY, CONNECTING MEMBER AND A METHOD FOR ITS MANUFACTURE, AND ELECTRONIC PART

(71) Applicants: Shunsaku Yoshikawa, Tokyo (JP); Yoshie Yamanaka, Tokyo (JP); Tsukasa Ohnishi, Tokyo (JP); Seiko Ishibashi, Tokyo (JP); Koji Watanabe, Tokyo (JP); Hiroki Ishikawa, Tokyo (JP); Yutaka Chiba, Tokyo (JP)

(72) Inventors: Shunsaku Yoshikawa, Tokyo (JP); Yoshie Yamanaka, Tokyo (JP); Tsukasa Ohnishi, Tokyo (JP); Seiko Ishibashi, Tokyo (JP); Koji Watanabe, Tokyo (JP); Hiroki Ishikawa, Tokyo (JP); Yutaka Chiba, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 145 days.

(21) Appl. No.: 14/314,043

(22) Filed: Jun. 25, 2014

(65) Prior Publication Data
US 2014/0326490 A1 Nov. 6, 2014

Related U.S. Application Data

(62) Division of application No. 13/261,199, filed as application No. PCT/JP2010/065018 on Sep. 2, 2010.

(30) Foreign Application Priority Data

Sep. 4, 2009 (JP) .................................. 2009-204189

(51) Int. Cl.
*H01L 23/495* (2006.01)
*B23K 35/00* (2006.01)
(Continued)

(52) U.S. Cl.
CPC .......... *H01L 23/495* (2013.01); *B23K 35/007* (2013.01); *B23K 35/0238* (2013.01);
(Continued)

(58) Field of Classification Search
CPC .. B23K 35/007; B23K 35/0238; B23K 35/26; C22C 28/00; C23C 24/103;
(Continued)

(56) References Cited

U.S. PATENT DOCUMENTS 4,065,600 A     12/1977  King et al. .................... 428/432
4,562,121 A *   12/1985  Thiemann et al. ........... 428/607
(Continued)

FOREIGN PATENT DOCUMENTS

JP       2217193       8/1990
JP       5294744       11/1993
(Continued)

OTHER PUBLICATIONS

Ivlev, V.I.; Yudin, V.A., Thermoemf. of indium-bismuth alloys in the melting-solidification region, Deposited Doc. (1976), VINITI 3581-76, (provided abstract only).
(Continued)

*Primary Examiner* — Keith Walker
*Assistant Examiner* — John Hevey
(74) *Attorney, Agent, or Firm* — Michael Tobias (57) ABSTRACT

A lead-free solder which can reduce the occurrence of voids and a connecting member which uses the solder and has excellent adhesion, bonding strength, and workability are provided. The lead-free solder alloy contains Sn: 0.1-3% and/or Bi: 0.1-2%, and a remainder of In and unavoidable impurities and has the effect of suppressing the occurrence of voids at the time of soldering. The connecting member is prepared by melting the lead-free solder alloy, immersing a metal substrate in the melt, and applying ultrasonic vibra-
(Continued)

tions to the molten lead-free solder alloy and the metal substrate to form a lead-free solder alloy layer on the surface of the metal substrate. A heat sink and a package are soldered to each other through this connecting member by reflow heating in the presence of flux.

15 Claims, 4 Drawing Sheets (51) Int. Cl.
  *B23K 35/02* (2006.01)
  *C22C 28/00* (2006.01)
  *H01L 23/373* (2006.01)
  *B23K 35/26* (2006.01)
  *C23C 24/10* (2006.01)
  *H01R 43/02* (2006.01)

(52) U.S. Cl.
  CPC .............. *B23K 35/26* (2013.01); *C22C 28/00* (2013.01); *C23C 24/103* (2013.01); *H01L 23/3736* (2013.01); *H01R 43/0235* (2013.01); *H01L 2924/0002* (2013.01)

(58) Field of Classification Search
  CPC ............... H01L 23/495; H01L 43/0235; H01L 23/3736; H01L 2924/0002
  See application file for complete search history.

(56) References Cited

U.S. PATENT DOCUMENTS

| | | | |
|---|---|---|---|
| 4,953,487 A | 9/1990 | Lewis | 118/620 |
| 4,966,142 A | 10/1990 | Zimmerman et al. | 228/262.9 |
| 5,328,813 A | 7/1994 | Strandjord et al. | 430/321 |
| 7,239,517 B2 * | 7/2007 | Fitzgerald | H01L 23/04 257/706 |
| 2003/0194551 A1 | 10/2003 | Sasa et al. | 428/332 |
| 2007/0228109 A1 * | 10/2007 | Smith et al. | 228/176 |
| 2008/0233682 A1 * | 9/2008 | Suh | H01L 23/3735 438/122 |
| 2008/0246145 A1 * | 10/2008 | Trezza | B23K 35/3013 257/737 |

FOREIGN PATENT DOCUMENTS

| | | |
|---|---|---|
| JP | 9057489 | 3/1997 |
| JP | 2001230349 | 8/2001 |
| JP | 2001269772 | 10/2001 |
| JP | 2002020143 | 1/2002 |
| JP | 2002542138 | 12/2002 |
| JP | 2007190603 | 8/2007 |
| WO | 9902299 | 1/1999 |

OTHER PUBLICATIONS

Konyukhova, N.P., Kuznetsov, V.A., Dudina, N.A., Electrocapillary phenomena on indium-bismuth alloys, Fiz. Khim. Poverkh. Yavlenii Rasplavakh (1971), 64-7. Editor(s): Eremenko, V.N. Publisher: "Naukova Dumka", Kiev, USSR. (provided abstract only).
Bi (Bismuth) Binary Alloy Phase Diagrams, Alloy Phase Diagrams, vol. 3 ASM Handbook, ASM International, 1992 p. 2.98-13.98.
Ohnuma, I., Cui, Y., Liu, X.J., Inohana, Y., Ishihara, S., Ohtani, H., Kainuma, R., Ishida, K., "Phase equilibria of Sn—In based microsoldering alloys", Journal of Electronic Materials (2000), 29(10), 1113-1121.
"Indalloy Technical Data Sheet", Matweb, Jan. 1, 2012, XP002691105, Retrieved from the Internet: URL: http://www.matweb.com/search/GetMatIsByTradename.aspx?tn=Indalloy%C2%AE.
"Lead-Free (Pb free)", Indium Corporation, Jan. 1, 2012, XP002691106, Retrieved from the Internet: URL: http://www.indium.com/solder-paste-and-powders/lead-free/.

* cited by examiner

<COMPARATIVE EXAMPLES>

LEAD-FREE SOLDER ALLOY, CONNECTING MEMBER AND A METHOD FOR ITS MANUFACTURE, AND ELECTRONIC PART

REFERENCE TO RELATED APPLICATIONS

This application is a divisional of U.S. application Ser. No. 13/261,199, which was the National Stage of International Application No. PCT/JP2010/065018, filed on Sep. 2, 2010.

TECHNICAL FIELD

This invention relates to a lead-free solder alloy, a connecting member and a method for its manufacture, and an electronic part. Specifically, it relates to a lead-free solder alloy which can decrease the occurrence of voids in solder joints, a connecting member using the lead-free solder alloy and a method for its manufacture, and an electronic part using the connecting member.

BACKGROUND ART

Decreases in the weight, thickness, and size of electronic parts are being promoted. In particular, miniaturization and densification of semiconductor packages (referred to below as packages) are being pushed with the development of multifunctionality of electronic parts. As a result, there is an upward trend in the amount of heat generated by packages such as BGAs. For this reason, there is a desire to further increase the ability of packages to dissipate heat.

Heat dissipating members which transmit heat to the exterior of packages such as heat sinks or radiation fins made of Al are widely used in order to improve the heat dissipating ability of packages. A heat dissipating member and a package are joined to each other by applying grease between them or by attaching the heat dissipating member to the package through a heat dissipating sheet or seal or the like. Joining by these means is inferior to metallic joining with respect to heat resistance, bonding strength, and adhesion. A heat dissipating member and a package are preferably metallically joined to each other with solder or the like.

In recent years, the use of Pb-containing solders (such as Sn—Pb eutectic solder) has been regulated in order to prevent environmental pollution. As a result, there is a trend for solders used for bumps of packages to be replaced by lead-free solders which do not contain lead. If a package which uses a lead-free solder for bump formation can be joined to the above-described heat dissipating member by reflow heating with a reflow profile for the lead-free solder while using flux, soldering of the heat dissipating member and soldering of the solder bumps of the package can be done simultaneously. As a result, in a mounting process, joining by soldering can be achieved by applying a thermal load only once, and the occurrence of manufacturing problems due to a thermal load such as warping of a package or remelting of bumps is minimized.

Indium (In) has a low melting point of 156° C. and good thermal conductivity, and it poses little threat of environmental pollution. Therefore, Patent Documents 1-3 disclose joining of two members to each other using indium.

A lead-free solder alloy made of indium (having an In content of substantially 100 mass %) has excellent ductility. If a small piece of a lead-free solder alloy made of indium is disposed between a heat dissipating member and a package in order to perform soldering, it is expected that the resulting solder joint can easily conform to surface irregularities formed in the joining surface by a thermal load, thereby making it possible to avoid peeling of the joined member which unavoidably occurs when joining with a resin or the like.

However, a lead-free solder alloy made of In has the problems that (a) it is so flexible that it is difficult to form it into a desired shape by punching to form a small piece or by rolling, and (b) in order to guarantee impact resistance, it is necessary for a small piece to have a thickness of 1.5-2.5 mm. This thickness makes it difficult to decrease the size and thickness of electronic parts, and at the time of soldering, the molten lead-free solder alloy oozes to outside of the joint, thereby adversely affecting the insulating properties of the package and causing a short circuit.

It is conceivable to perform soldering with this lead-free solder alloy by, for example, (i) applying a flux to the surface of a metal substrate of a material such as Cu, Ni, or Au having good thermal conductivity, (ii) forming a lead-free solder layer on the surface of the metal substrate by the molten solder plating method (the hot dip plating method) in which the substrate is dipped in molten solder to obtain a connecting member, and (iii) disposing the connecting member between a heat dissipating member and a package and performing reflow heating in the presence of a flux.

PRIOR ART DOCUMENTS

Patent Documents

Patent Document 1: JP 2002-020143 A
Patent Document 2: JP 2002-542138 A
Patent Document 3: JP 2001-230349 A

DISCLOSURE OF INVENTION

As a result of investigations, the present inventors found that if the above-described connecting member having a lead-free solder alloy layer made of In on its surface is disposed between a heat dissipating member and a package and is then subjected to reflow heating, a large amount of voids develops inside the resulting joints between the connecting member and the heat dissipating member or the package. Therefore, the strength of the joints and the adhesion between the heat dissipating member and the package are inadequate.

A flux is normally used in the manufacture of the above-described connecting member. It was also found that flux residue which unavoidably remains in the solder layer further induces the occurrence of voids inside the joints.

As a result of diligent investigations aimed at solving the above-described problems, the present inventors made the following findings and completed the present invention.

(i) A lead-free solder alloy having In as a main component to which a small amount of Sn or Bi is added singly or in combination exhibits good wettability at the time of soldering due to the effect of Sn or Bi without adversely affecting the characteristic ductility of In. As a result, the above-described lead-free solder alloy can increase the ability of voids to escape from a solder joint and can decrease the amount of voids remaining inside the joint.

(ii) It is preferable to immerse a metal substrate in the above-described lead-free solder alloy in a molten state and apply ultrasonic vibrations to the molten lead-free solder alloy and the metal substrate, whereby a lead-free solder alloy layer having improved thermal conductivity can be formed on the surface of the metal substrate without using flux while maintaining adequate adhesion.

The present invention is a lead-free solder alloy characterized by having a chemical composition consisting essentially of Sn: 0.1-3% (in this description, unless otherwise specified, % with respect to chemical composition means mass %), and/or Bi: 0.1-2%, and a remainder of In and unavoidable impurities.

From another standpoint, the present invention is a connecting member comprising a metal substrate which preferably has a chemical composition containing at least 95% of Cu, and a lead-free solder alloy layer formed on at least connection regions of the metal substrate, characterized in that the lead-free solder alloy layer has the above-described chemical composition for a lead-free solder alloy.

Because this connecting member has a lead-free solder alloy layer on the surface of a metal substrate, its thickness can be decreased. Furthermore, it has good shape retention when it is subjected to punching so as to form small pieces or when it is subjected to rolling, so it has excellent mass producibility and workability.

From another standpoint, the present invention is a method of manufacturing a connecting member, characterized by immersing a metal substrate in a lead-free, solder alloy which has the above-described chemical composition and is in a molten state, and preferably applying ultrasonic vibrations to the metal substrate and the molten lead-free solder alloy after immersing the metal substrate in the lead-free solder alloy, thereby forming a lead-free solder alloy layer at least on connection regions of the metal substrate. This method can form a lead-free solder alloy layer having improved thermal conductivity on the surface of a metal substrate without using flux while maintaining adequate adhesion. As a result, the occurrence of voids caused by flux residue remaining in the solder layer can be decreased, and the need to take anti-pollution measures and measures for dealing with waste water caused by halides contained in flux is eliminated.

From yet another standpoint, the present invention is an electronic part characterized by comprising the above-described connecting member according to the present invention, and a first member (for example, a package such as a BGA mounted on a printed circuit board) and a second member (such as a heat dissipating member) both disposed so as to contact the connecting member in a connection region, wherein the first member and the second member are connected to each other through the connecting member by reflow heating of the first member and the second member in the presence of a flux.

As a result, the first member and the second member are connected to each other through a metal connecting member according to the present invention, and as described above, the connecting member can suppress the occurrence of voids in the resulting joints. Therefore, it is possible to perform connection with improved adhesion and bonding strength. Specifically, the suppressed occurrence of voids is exemplified by the fact that the below-described voids rate in the joints between the connecting member and the first member and between the connecting member and the second member can be suppressed to at most 33.0%.

Voids rate: A solder alloy sheet to be tested having a thickness of 100 μm and measuring 5 mm×5 mm which is sandwiched between electroless nickel and gold plated lands each measuring 5 mm×5 mm after flux is applied to the lands is subjected to reflow heating with a reflow profile having a peak temperature of 160° C., and then the proportion of the area of voids with respect to the area of the lands is measured 3 times using an X-ray inspection apparatus (TOSMICRON 6090 FP made by Toshiba IT & Control Systems Corporation), the average of 3 measurements being made the voids rate.

A lead-free solder alloy according to the present invention allows voids to easily escape from a solder joint of a connecting member to a first member or a second member, so the amount of voids remaining inside the joint can be decreased, and the adhesion and bonding strength of the first member and the second member are increased.

A connecting member according to the present invention can achieve a decrease in thickness, and it has good shape retention when it is punched to form small members or is subjected to rolling, so it has excellent mass producibility and workability.

A method of manufacturing a connecting member according to the present invention can decrease the occurrence of voids caused by flux residue remaining in a solder layer, and it can eliminate the necessity for environmental countermeasures and measures for waste water treatment caused by halides contained in flux.

In addition, in an electronic part according to the present invention, a first member (for example, a package such as a BGA mounted on a printed circuit board) and a second member (such as a heat dissipating member) can be connected to a connecting member with good adhesion and a good bonding strength while markedly suppressing the occurrence of voids in the joints.

1: second member
2: lead-free solder alloy layer
3: copper substrate
4: first member
5: connecting member
6: electronic part

MODES FOR CARRYING OUT THE INVENTION

A lead-free solder alloy, a connecting member and a method for its manufacture, and an electronic part according to the present invention will be sequentially explained.

1. Lead-Free Solder Alloy

The reasons why the chemical composition of a lead-free solder alloy is limited as described above will be explained.

Having the chemical composition of a lead-free solder alloy satisfy the above-described ranges improves the wettability of a lead-free solder alloy at the time of soldering. As a result, the ability of voids to escape from a solder joint to a first member or a second member is increased, and the amount of voids remaining inside the joint is markedly decreased. Accordingly, the adhesion and bonding strength of a first member and a second member which are connected by soldering are increased.

Specifically, if the Sn content is less than 0.1%, the solder alloy will have a decreased reactivity with Cu, Ni, or Au which forms a substrate, thereby forming a connecting member which cannot exhibit the functions required of a connecting member. If the Sn content exceeds 3%, the voids rate in a joint is no longer suppressed to a desired level. Therefore, the Sn content is limited to 0.1-3%.

If the Bi content is less than 0.1%, the solder alloy will have decreased wettability, leading to poor solderability. If the Bi content exceeds 2%, brittleness occurs in the alloy to such an extent that a joint becomes brittle, and it is no longer possible to form a connecting member. Therefore, the Bi content is limited to 0.1-2%.

The chemical composition of the lead-free solder alloy is also made to satisfy the above-described ranges so that the lead-free solder alloy will melt at a temperature in the range of 130-160° C. The reason for this temperature range is as follows.

Lead-free solders which are commonly used for bumps for packages include binary alloys such as Sn-3.5Ag (melting point of 221° C.; the temperatures given below in parentheses are all melting points), Sn-5Sb (235-240° C.), Sn-0.75Cu (227° C.), Sn-2In (224-229° C.), Sn-58Bi (139° C.), and Sn-9Zn (199° C.), as well as ternary or higher alloys in which one or more additional elements are added to the above binary alloys. It is thought that Sn—Pb eutectic solder (melting point of 183° C.) will continue to be used for some bumps employed in packages.

The present invention is intended for use in connection of a package having bumps made of the above-described solder to a heat dissipating member by heating them with a reflow profile of a lead-free solder alloy according to the present invention. As described above, some solders used for the bumps of a package have a low melting point. Therefore, a lead-free solder according to the present invention preferably has a low melting point.

On the other hand, in order to guarantee heat resistance, the melting point of a lead-free solder alloy according to the present invention needs to be not lower than 125° C., which is a typical temperature used in the Change of Temperature Test prescribed by JIS C 0025. From the standpoint of practicality, the melting point needs to be at least 130° C. The reflow profile is typically set to a temperature around 20° C. higher than the liquidus temperature of the solder.

For the above reasons, a lead-free solder alloy according to the present invention is preferably one which melts at a temperature of not lower than 130° C. and not higher than 160° C. Therefore, the chemical composition of a lead-free solder alloy according to the present invention is limited as set forth above.

Furthermore, by having the chemical composition of a lead-free solder alloy satisfy the above-described range, not only is the excellent thermal conductivity and ductility of indium retained, but there is also a low concern of environmental pollution. Good thermal conductivity makes it possible to efficiently transmit heat which is generated in a package to a heat dissipating member. In addition, good ductility increases the ability of the solder to conform to surface irregularities produced in the joining surface by thermal loads, whereby peeling of a package or a heat dissipating member can be avoided.

For the above reasons, the chemical composition of a lead-free solder alloy according to the present invention is made the following:

(a) Sn: 0.1-3% and a remainder of In and unavoidable impurities,
(b) Bi: 0.1-2% and a remainder of In and unavoidable impurities, or
(c) Sn: 0.1-3%, Bi: 0.1-2%, and a remainder of In and unavoidable impurities.

As long as the above-described characteristics are not impaired, a lead-free solder alloy according to the present invention may contain one or more of Al: at most 0.01%, Ni: at most 0.1%, and Cu: at most 0.1%. The addition of at most 0.01% of Al to the alloy is expected to improve ductility, and the addition of Ni: at most 0.1% and/or Cu: at most 0.1% to the alloy is expected to improve solderability.

2. Connecting Member and a Method for its Manufacture

A connecting member comprises a metal substrate and a lead-free solder alloy layer. These will be sequentially explained.

[Metal Substrate]

The metal substrate has connection regions on all or a portion thereof for joining a first member and a second member. For example, the metal substrate may have a first connection region for connection to a first member on all or a portion of one side thereof, and a second connection region for connection to a second member on all or a portion of the other side thereof.

The metal substrate is preferably a copper substrate having a chemical composition with a Cu content of at least 95% because such a substrate has high thermal conductivity, excellent workability, and good reactivity with the above-described lead-free solder alloy. The thickness of the copper substrate is preferably 0.05-0.5 mm from the standpoints of guaranteeing the strength of the connecting member and decreasing its thickness.

Instead of the above-described copper substrate, a metal substrate such as a Ni or Au substrate which reacts with Sn or Bi and In may be used.

[Lead-Free Solder Alloy Layer]

A lead-free solder alloy layer is formed on at least the connection regions of the metal substrate. This lead-free solder alloy layer has the above-described chemical composition.

The thickness of the lead-free solder alloy layer is preferably 15-60 μm per side in order to guarantee good solderability. The lead-free solder alloy layer may be formed only in portions of one or both sides of a metal substrate where the substrate needs to be connected to the first member or the second member, or it may be formed over the entire surface of one or both sides of the metal substrate.

Because the connecting member has a lead-free solder alloy layer on the surface of a metal substrate, it is possible to achieve a decrease in thickness. Furthermore, because it has good shape retention when it is punched to form a small piece or when it undergoes rolling, it has excellent mass producibility and workability.

[Manufacturing Method]

A connecting member is manufactured by immersing the above-described metal substrate in a lead-free solder alloy which has the above-described chemical composition and is in a molten state.

It is possible to use a flux in a conventional manner before immersion. Instead, in a preferred embodiment, after the metal substrate is immersed in the molten lead-free solder alloy, ultrasonic vibrations are applied to the metal substrate and the lead-free solder alloy, thereby forming a lead-free solder alloy layer at least in the connection regions of the metal substrate.

For example, the ultrasonic vibrations applied to the metal substrate and the lead-free solder alloy are at 40 kHz with the distance between the substrate and the horn (resonator) being 2 mm.

As a result, a lead-free solder alloy layer can be formed on the surface of the metal substrate while maintaining adequate adhesion without using flux. Therefore, the occurrence of voids caused by flux residue remaining in a solder layer is eliminated, and the need to take environmental countermeasures and measures for waste water treatment due to halides contained in flux are eliminated.

In the present invention, the properties of a connecting member can be freely varied by suitably varying the materials, the thickness, and the shape of the metal substrate and the composition of the lead-free solder alloy layer which is formed. The speed of reaction between the metal substrate and the lead-free solder alloy varies depending on the chemical compositions of the metal substrate and the lead-free solder alloy layer. However, by suitably varying the feed speed (the length of immersion in a molten solder bath), the temperature of the molten solder bath, and the cooling speed when forming the lead-free solder alloy layer, it is possible to control the thickness of the lead-free solder alloy layer.

By using the above methods, the properties of a connecting member (such as its heat resistance, adhesion, and bonding strength) can be suitably varied in accordance with various properties demanded of a connecting member.

3. Electronic Part

Figure 1:
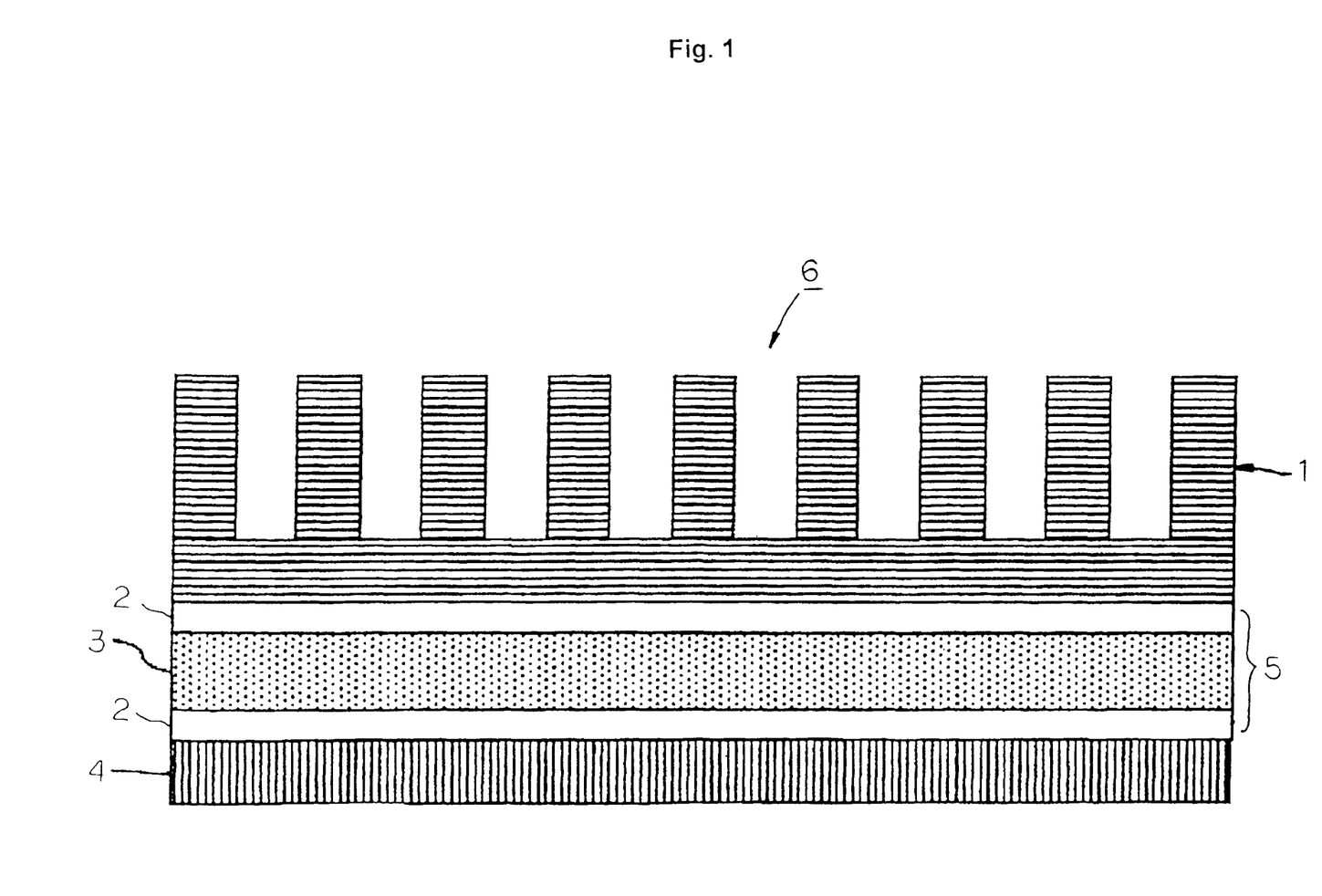
FIG. 1 is a front cross-sectional view of an electronic part according to the present invention.

FIG. 1 is a front cross-sectional view of an electronic part according to the present invention.

A connecting member 5 according to the present invention having a lead-free solder alloy layer 2 formed on both sides of a copper substrate 3 was placed atop a first member 4 (for example, a package such as a BGA mounted on a printed circuit board), and then a second member 1 (for example, a heat dissipating member in the form of an Al heat sink) was placed atop the connecting member 5.

Then, while maintaining this state, the first member 4, the second member 1, and the connecting member 5 were together subjected to reflow heating in the presence of a flux, and the first member 4 and the second member 1 were connected to each other through the connecting member 5.

Figure 2:
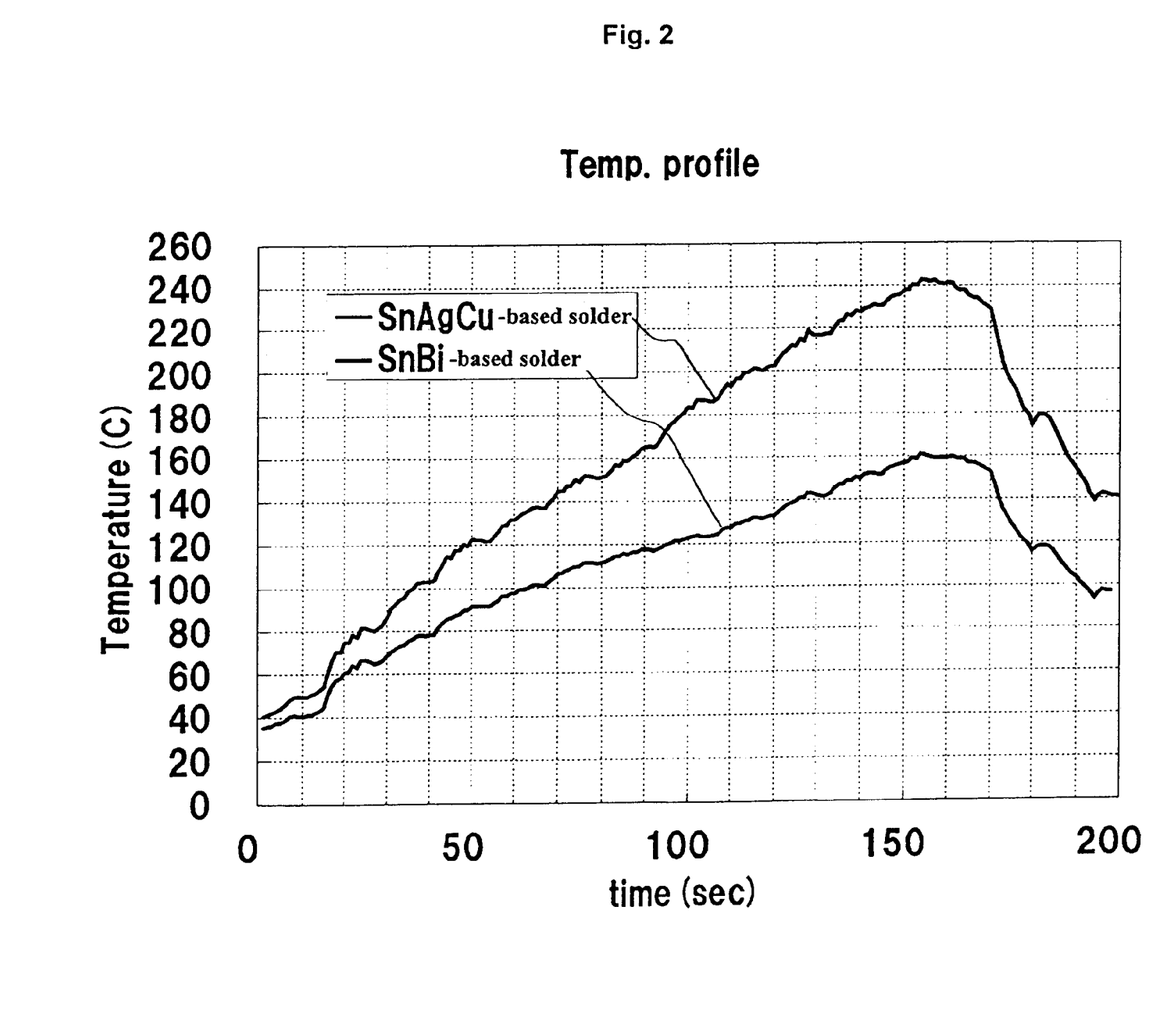
FIG. 2 is a graph showing an example of a reflow profile.

The reflow profile varies depending on the alloy composition of the lead-free solder paste which is supplied by printing to other surface mounted parts on a board. FIG. 2 is a graph showing an example of a reflow profile.

As shown by the graph in FIG. 2, when the alloy composition of the lead-free solder paste which is supplied is a typical Sn—Ag—Cu based alloy, a reflow profile having a peak temperature of around 240° C. and a melting period of 220° C. or above of around 40 seconds is preferred. When a low melting point solder alloy such as a Sn—Bi based alloy is supplied, a reflow profile with a peak temperature of around 160° C. and a melting period at 140° C. or above of around 40 seconds is preferred.

As a result of either profile, the first member 4 and the second member 1 are connected to each other through the metal connecting member 5 according to the present invention. As described above, the connecting member 5 can suppress the occurrence of voids in the resulting joints, so an electronic part 6 in which the first member 4 and the second member 1 are connected to the connecting member 5 with adequate adhesion and with a high bonding strength is manufactured.

Specifically, the below-described voids rate in the joint between the connecting member 5 and the first member 4 and the joint between the connecting member 5 and the second member 1 is restrained to at most 33.0%.

Voids rate: A solder alloy sheet to be tested having a thickness of 100 μm and measuring 5 mm×5 mm which is sandwiched between electroless nickel and gold plated lands each measuring 5 mm×5 mm after flux is applied to the lands is subjected to reflow heating with a reflow profile having a peak temperature of 160° C., and then the proportion of the area of voids with respect to the area of the lands is measured 3 times using an X-ray inspection apparatus (TOSMICRON 6090 FP made by Toshiba IT & Control Systems Corporation). The average of 3 measurements is made the voids rate.

In the present invention, the connecting member has a metal substrate coated with solder. When this member is actually connected to a heat sink, the coated solder reacts with a plated coating formed on the heat sink. Therefore, the effects of the present invention can be fully reproduced by the above-described evaluation method using a solder alloy sheet having a thickness of 100 μm and measuring 5 mm×5 mm.

A connecting member according to the present invention can be prepared by immersing a metal substrate which has previously been formed so as to have a suitable shape in a molten solder bath containing a molten lead-free solder alloy according to the present invention, and applying ultrasonic vibrations to the molten solder and the metal substrate to form a lead-free solder alloy layer.

Alternatively, after a lead-free solder alloy layer is formed on the metal substrate, the metal substrate may undergo forming such as punching. As a result, it is possible to form a connecting member into a shape such as a pellet or a washer, and it is possible to form it into a shape matching the periphery of a BGA or the like. It may also be used in the form of an electrically conducting connecting tape which is obtained by working.

The present invention can be used not only for connection of heat dissipating members, but as it can form a lead-free solder alloy layer on the surface of a metal substrate without using flux, it can be used to connect members inside a semiconductor part where it is desirable to avoid the use of flux.

EXAMPLE 1

Figure 3:
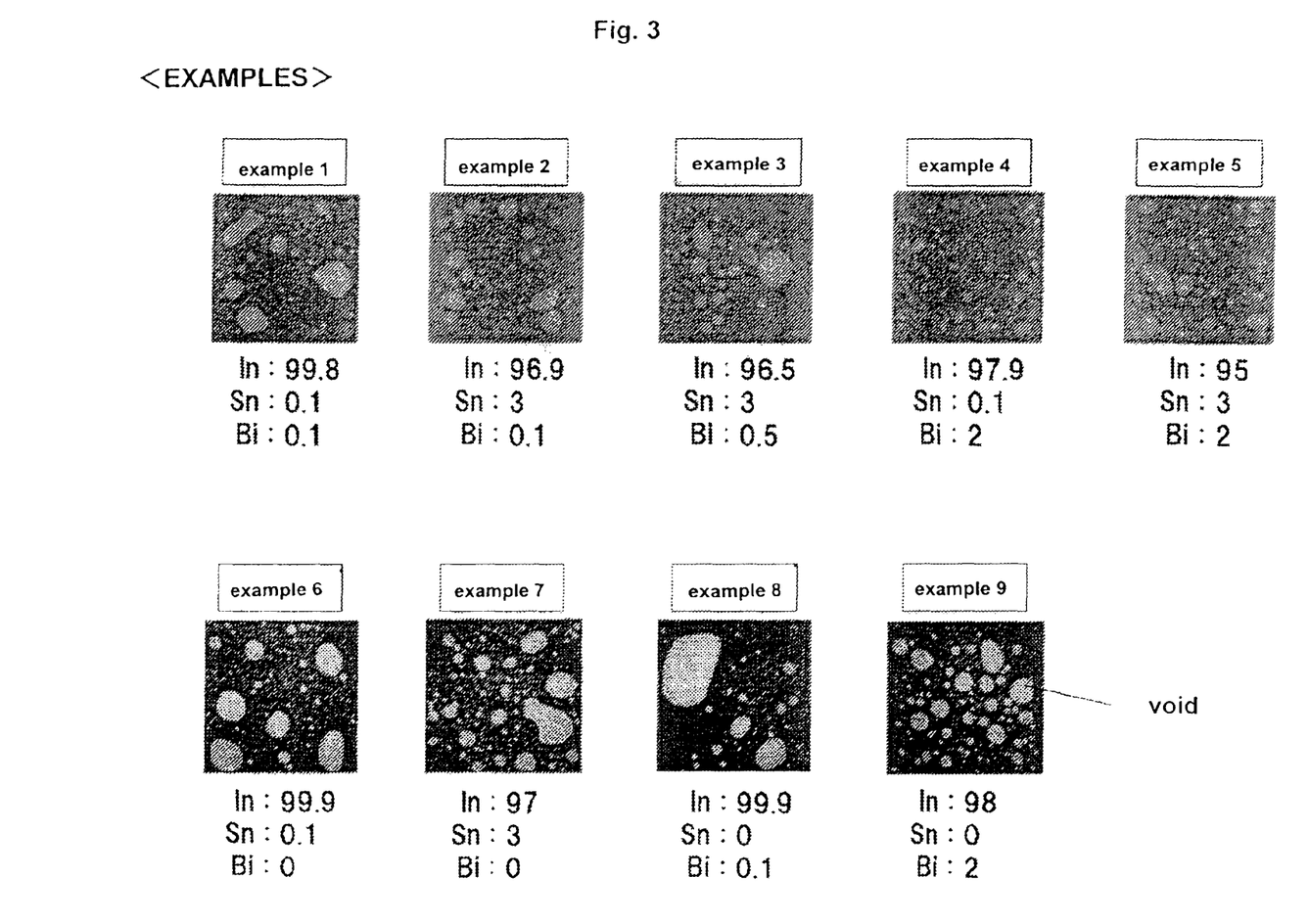
FIG. 3 shows X-ray photographs of the state of occurrence of voids in examples of the present invention.
Figure 4:
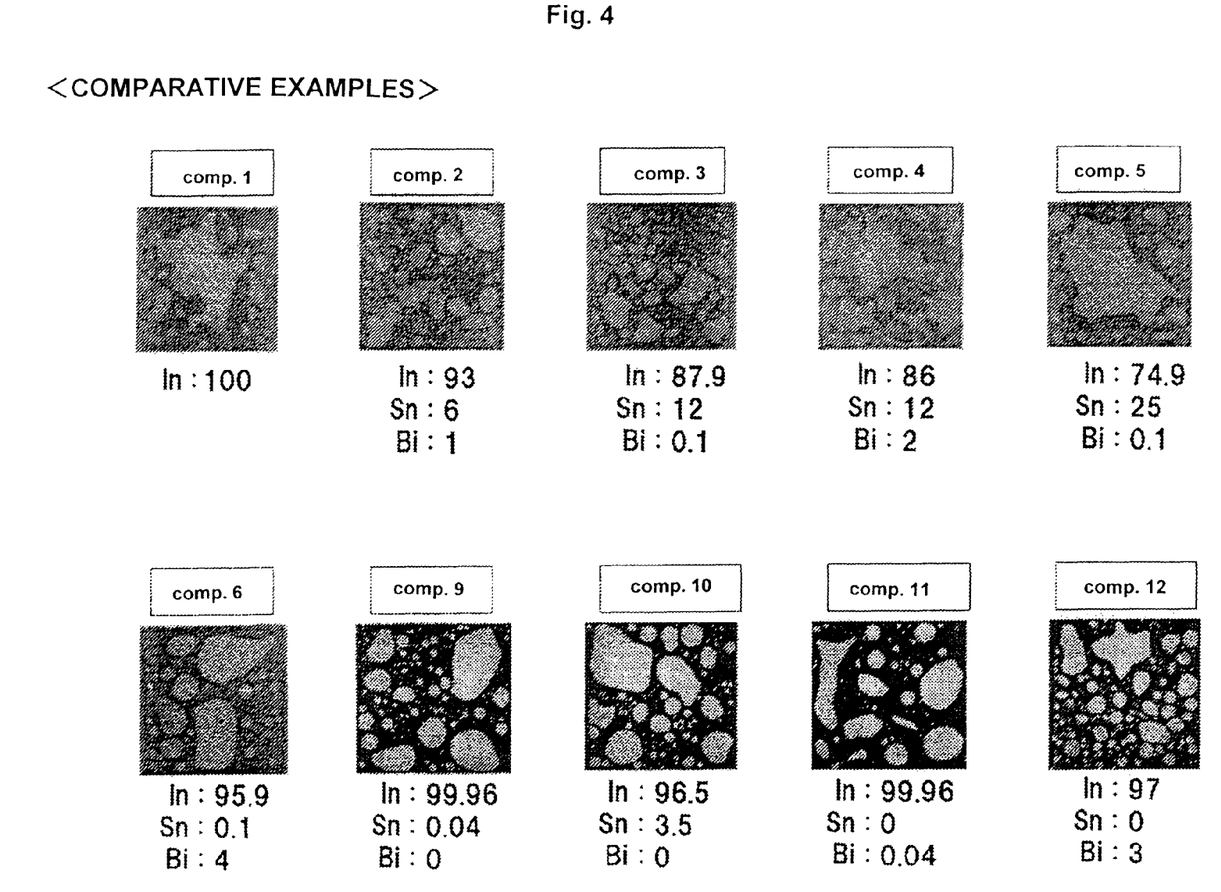
FIG. 4 shows X-ray photographs of the state of occurrence of voids in comparative examples of the present invention.

Examples of the present invention are shown in Table 1 and FIG. 3, and comparative examples are shown in Table 1 and FIG. 4.

TABLE 1

| | Composition (mass %) | | | Melting temperature (° C.) | | Suit-ability | Voids rate (%) |
|---|---|---|---|---|---|---|---|
| | In | Sn | Bi | Solidus temp. | Liquidus temp. | | |
| Example 1 | 99.8 | 0.1 | 0.1 | 157 | 157 | ○ | 23.9 |
| Example 2 | 96.9 | 3 | 0.1 | 145.7 | 152.4 | ○ | 25.5 |
| Example 3 | 96.5 | 3 | 0.5 | 151.4 | 153.5 | ○ | 31.3 |
| Example 4 | 97.9 | 0.1 | 2 | 149.3 | 154.8 | ○ | 21.2 |
| Example 5 | 95 | 3 | 2 | 144.7 | 150.9 | ○ | 32.8 |
| Example 6 | 99.9 | 0.1 | 0 | 156 | 156.6 | ○ | 21 |
| Example 7 | 97 | 3 | 0 | 152.9 | 153.7 | ○ | 27.9 |
| Example 8 | 99.9 | 0 | 0.1 | 156.1 | 156.6 | ○ | 25.6 |
| Example 9 | 98 | 0 | 2 | 149.5 | 152.8 | ○ | 21.1 |
| Comp. 1 | 100 | 0 | 0 | 157 | 157 | ○ | 44.6 |
| Comp. 2 | 93 | 6 | 1 | 145.6 | 149 | ○ | 42.1 |
| Comp. 3 | 87.9 | 12 | 0.1 | 142.1 | 144.6 | ○ | 39.1 |
| Comp. 4 | 86 | 12 | 2 | 133.4 | 139.8 | ○ | 59.9 |
| Comp. 5 | 74.9 | 25 | 0.1 | 131.3 | 133 | ○ | 53.7 |
| Comp. 6 | 95.9 | 0.1 | 4 | 140.1 | 150 | ○ | 40.4 |
| Comp. 7 | 94.9 | 0.1 | 5 | 129.7 | 147.2 | X | ND |
| Comp. 8 | 69.9 | 30 | 0.1 | 127 | 129 | X | ND |
| Comp. 9 | 99.96 | 0.04 | 0 | 156 | 156.6 | ○ | 33.4 |
| Comp. 10 | 96.5 | 3.5 | 0 | 152.1 | 153 | ○ | 44.3 |
| Comp. 11 | 99.96 | 0 | 0.04 | 156.1 | 156.8 | ○ | 33.8 |
| Comp. 12 | 97.5 | 0 | 3 | 145.1 | 151.3 | ○ | 38.5 |

ND: not determined

The melting temperature of the solder was measured using a differential thermal analyzer. The analyzer was a DSC 6200 manufactured by Seiko Instruments Inc. The rate of temperature increase was 5° C. per minute, and the weight of a measurement sample was 10±1 mg. The solidus temperature was the starting point of the endothermic peak of the heating curve obtained in differential thermal analysis, and the liquidus temperature was the end point of the endothermic peak of the heating curve in differential thermal analysis. Based on the results of this analysis, the suitability of the melting temperature was evaluated as CIRCLE (O, acceptable) for examples in which the solidus temperature of the solder was not lower than 130° C. and the liquidus temperature was not higher than 160° C., and the suitability was evaluated as X (unacceptable) for other examples.

The voids rate was measured by the above-described method. Flux was applied by printing using a metal mask with a thickness of 100 μm. Therefore, the applied amount of flux was the same for all of the samples.

$$Rv = Sv/Sl \times 100$$

Rv: voids rate (%)
Sv: sum of area of voids
Sl: area of each land (25 mm²)

As is clear from Table 1 and FIGS. 3 and 4, a lead-free solder alloy according to the present invention has a melting point in the range of 130-160° C., and it has adequate melting properties with a reflow profile having a peak of 160° C.

Taking into consideration thermal conductivity and the adhesion between a lead-free solder alloy layer and a member to which it is connected, it is preferable for a joint to have decreased voids, and it is also necessary for a lead-free solder alloy to have good wettability with respect to Cu. Since Bi and Sn increase the wettability of a lead-free solder alloy with respect to Cu, the voids rate was decreased by the addition of Bi or Sn.

Because the melting points of Comparative Examples 7 and 8 did not fall into the range of 130-160° C., the voids rate was not calculated for these comparative examples.

The invention claimed is:

1. An electronic part comprising:
   a connecting member comprising a metal backing member which has a chemical composition with a Cu content of at least 95 mass %, a first side having a first connection region and a second side having a second connection region, a first layer of a lead-free solder alloy which is formed on the entire first side of the backing member, and a second layer of the lead-free solder alloy which is formed on the entire second side of the backing member, the lead-free solder alloy consisting of (A) at least one of Sn: 0.1-3 mass % and Bi: 0.1-2 mass %, (B) at least 95 mass % of In, and (C) a remainder of unavoidable impurities; and
   a packaged electronic component contacting the first connection region and a heat sink contacting the second connection region of the backing member and being connected with each other through the connecting member by reflow heating of the connecting member, the packaged electronic component, and the heat sink in the presence of a flux.

2. An electronic part as claimed in claim 1 wherein the connecting member is connected to the packaged electronic component and the heat sink by joints having a voids rate as defined below of at most 33.0%;
   Voids rate: A solder alloy sheet made of the lead-free solder alloy of claim 1 and having a thickness of 100 μm and measuring 5 mm×5 mm is sandwiched between electroless nickel and gold plated lands each measuring 5 mm×5 mm after flux is applied to the lands and is subjected to reflow heating with a reflow profile having a peak temperature of 160° C. and then the proportion of the area of voids with respect to the area of the lands is measured 3 times using an X-ray inspection apparatus (TOSMICRON 6090 FP made by Toshiba IT & Control Systems Corporation), the average of 3 measurements being made the voids rate.

3. An electronic part as claimed in claim 1 wherein the lead-free solder alloy consists of 0.1-3 mass % of Sn and a remainder of In and unavoidable impurities.

4. An electronic part as claimed in claim 1 wherein the lead-free solder alloy consists of 0.1-2 mass % of Bi and a remainder of In and unavoidable impurities.

5. An electronic part as claimed in claim 1 wherein the lead-free solder alloy consists of 0.1-3 mass % of Sn, 0.1-2 mass % of Bi, and a remainder of In and unavoidable impurities.

6. An electronic part as claimed in claim 1 wherein the lead-free solder alloy has a solidus temperature and a liquidus temperature each in the range of 130-160° C.

7. An electronic part as claimed in claim 1 wherein the layers of the lead-free solder alloy are formed by immersing the backing member in the lead-free solder alloy in a molten state.

8. An electronic part as claimed in claim 1 wherein the packaged electronic component is a BGA package.

9. An electronic part as claimed in claim 1 wherein the connecting member is selected from a pellet, a washer, and a connecting tape.

10. An electronic part as claimed in claim 1 wherein the heat sink comprises a flat base having a bottom side facing the connecting member and a top side facing away from the connecting member, and a plurality of projections formed on the top side of the base and extending away from the connecting member.

11. An electronic part as claimed in claim 1 wherein the backing member has a thickness of 0.05-0.5 mm, and the first and second layers each have a thickness of 15-60 μm.

12. An electronic part as claimed in claim 1 wherein the connecting member is sandwiched between the packaged electronic component and the heat sink.

13. An electronic part as claimed in claim 1 wherein each of the solder layers is bonded directly to a surface of the metal backing member.

14. An electronic part comprising:
   a connecting member comprising a metal backing member which has a chemical composition with a Cu content of at least 95 mass %, a first side having a first connection region and a second side having a second connection region, a first layer of a lead-free solder alloy which is formed on the entire first side of the backing member, and a second layer of the lead-free solder alloy which is formed on the entire second side of the backing member, the first and second layers of the lead-free solder alloy being formed on the backing member by immersing the backing member in the lead-free solder alloy in a molten state, the lead-free solder alloy consisting of (A) at least one of Sn: 0.1-3 mass % and Bi: 0.1-2 mass %, (B) at least 95 mass % of In, and (C) a remainder of unavoidable impurities; and
   a packaged electronic component contacting the first connection region and a heat sink contacting the second connection region of the backing member with the connecting member being sandwiched between the packaged electronic component and the heat sink, the connecting member being connected to the packaged electronic component and the heat sink by solder joints formed by reflow heating of the connecting member, the packaged electronic component, and the heat sink in the presence of a flux.

15. An electronic part as claimed in claim 14 wherein the connecting member is connected by a solder joint to an exterior surface of the packaged electronic component.

* * * * *